(12) United States Patent
Nagakubo et al.

(10) Patent No.: US 6,972,405 B2
(45) Date of Patent: Dec. 6, 2005

(54) NANOSCALE STANDARD SAMPLE AND ITS MANUFACTURING METHOD

(75) Inventors: Yasuhira Nagakubo, Hitachinaka (JP); Mitsuhiko Yamada, Naka (JP); Kouichi Kurosawa, Hitachi (JP)

(73) Assignees: Hitachi High-Technologies Corporation, Tokyo (JP); Hitachi Science Systems, Ltd., Hitachinaka (JP)

( * ) Notice: Subject to any disclaimer, the term of this patent is extended or adjusted under 35 U.S.C. 154(b) by 153 days.

(21) Appl. No.: 10/717,485

(22) Filed: Nov. 21, 2003

(65) Prior Publication Data

US 2005/0017162 A1    Jan. 27, 2005

(30) Foreign Application Priority Data

Nov. 25, 2002  (JP) .............................. 2002-340468

(51) Int. Cl.[7] ........................ H01J 49/00; G01D 18/00; G01N 1/28
(52) U.S. Cl. ................... 250/252.1; 250/306; 250/307; 250/310; 250/311
(58) Field of Search ............................ 250/252.1, 306, 250/307, 310, 311

(56) References Cited

U.S. PATENT DOCUMENTS

| 6,570,157 B1 * | 5/2003 | Singh et al. ................ 250/311 |
| 6,573,497 B1 * | 6/2003 | Rangarajan et al. ........ 250/306 |
| 6,573,498 B1 * | 6/2003 | Rangarajan et al. ........ 250/307 |

FOREIGN PATENT DOCUMENTS

JP           8-31363         2/1996

* cited by examiner

Primary Examiner—Nikita Wells
(74) Attorney, Agent, or Firm—Dickstein Shapiro Morin & Oshinsky LLP

(57) ABSTRACT

An indicator indicating the direction of a diffraction grating pattern is provided on a chip so that the direction of the pattern can be accurately determined. The indicator includes an anisotropic shape of the chip and the formation of a marking-off line or a mark on the chip, allowing the direction of the diffraction grating pattern to be determined from the external appearance of the chip. As a result, the chip can be mounted on a sample base while accurately determining the direction of the diffraction grating pattern, thus allowing a calibration operation to be performed accurately and reliably.

11 Claims, 8 Drawing Sheets

PROTECTION FILM APPLIED

DICING

PROTECTION FILM REMOVED (a)

(b)

NANOSCALE STANDARD SAMPLE AND ITS MANUFACTURING METHOD

BACKGROUND OF THE INVENTION

1. Technical Field

The invention relates to a nanoscale standard sample used for calibrating magnifications or sizes in electron microscopes such as scanning electron microscopes, and a method of manufacturing the sample.

2. Background Art

For measuring the size of fine patterns in semiconductor integrated elements, for eample, a length-measuring SEM is employed whereby lengths are measured using electron beam scanning. When calibrating magnifications or sizes in a scanning electron microscope such as the length-measuring SEM, a resist pattern is used that is formed on a silicon wafer by optical projection exposure or electron beam exposure. The wafer is placed inside the apparatus during calibration, or a minutely cut standard sample for calibration is affixed on the apparatus stage and calibration is carried out using the pattern as the reference.

In the conventional standard sample utilizing a chip having a diffraction grating pattern, a reference mark is provided on the surface of a sample base for mounting the chip, as an indicator of the diffraction grating pattern direction (JP Patent Publication (Kokai) No. 8-31363). In this case, there is the possibility of operation error such as affixing the chip in a wrong pattern direction, unless the diffraction grating pattern direction can be accurately recognized. In reality, however, it is not easy to visually determine the direction of the pattern without error. Thus, the chip cannot be disposed in a correct direction even if the reference mark is formed on the sample base.

Further, as a method of affixing the chip during the manufacturing process, after glue is applied, the chip surface is pushed down by tweezers or the like used for transporting the chip, thus fixing the chip. This method, however, not only results inevitably in leaving scratches on the chip surface but also causes a pattern fall, thus adversely affecting the look and size precision of the chip.

(Patent Document 1) JP Patent Publication (Kokai) No. 8-31363 (Abstract)

SUMMARY OF THE INVENTION

It is the object of the present invention to:
(1) provide a chip with an indicator indicating the direction of the diffraction grating pattern, such that the chip can be positioned on a sample base in an accurate direction visually.
(2) provide a method of affixing a chip such that the chip surface is not scratched.

The invention provides a nanoscale standard sample comprising a sample base on which a chip having a diffraction grating pattern formed thereon is attached. The chip is provided with an indicator permitting the direction of the diffraction grating pattern to be determined from the external appearance of the indicator. The invention also provides a nanoscale standard sample comprising a sample base on which two chips are attached. Each chip is provided with an indicator permitting the direction of the diffraction grating pattern to be determined from the external appearance of the indicator, the chips being attached on the sample base such their diffraction grating patterns are perpendicular to each other.

In accordance with the invention, the indicator formed on a chip permitting a visual determination of the direction of the diffraction grating pattern can be realized in various manners, including the following:

(1) Unlike the square or rectangular shape of the chip, one of the corners of the chip is cut off so as to allow the direction of the chip to be easily determined.

(2) The chip is processed into a rectangular shape such that the direction of the diffraction grating pattern on the chip is in parallel to or perpendicular to the longitudinal or width direction of the chip.

(3) The chip is provided with a color indicating the direction of the diffraction grating pattern, or a plurality of chips with different colors are arranged, so that the direction of the pattern can be easily determined.

(4) A marking-off line is provided on the chip perpendicular to or in parallel with the direction of the diffraction grating pattern.

(5) Laser marking is provided on the chip so that the direction of the diffraction grating pattern can be determined.

(6) The indicator is provided on the chip by chemical etching perpendicular to or in parallel with the direction of the diffraction grating pattern.

(7) A protection film is coated in advance to prevent foreign matter such as chip fragments, which could be produced when providing the marking-off line or a marking, from being attached to the diffraction grating pattern on the chip, a marking-off line is provided, and then the protection film is removed.

(8) A through-hole is provided at the center of the sample base and then the chip is affixed by vacuum adsorption via the through-hole. In this way, the chip surface can be prevented from being scratched upon contact with items.

DETAILED DESCRIPTION OF THE PREFERRED EMBODIMENTS

On a part of a chip having a diffraction grating pattern formed thereon, an indicator is formed by mechanical, chemical or electromagnetic-wave processing, the indicator being used for visually determining the direction of the diffraction grating pattern. The mechanical processing refers to dicing. The chemical processing refers to chemical etching. The electromagnetic-wave processing refers to laser marking. The indicator is marking-off lines, an etching mark, or laser marking, respectively.

When marking-off lines or a mark is provided by dicing or laser marking, the chip surface is coated with a protective film to prevent the attachment of foreign matter on the chip surface. Prior to processing, the chip with the diffraction grating pattern can be affixed to the sample base by a vacuum adsorbing method. By attaching one or two of such chips to the sample base, the direction of the diffraction grating pattern can be reliably determined.

FIGS. 1, 2, 3, 4 and 5 show embodiments in which the external appearance of the chip is provided with various features so as to clarify the direction of the diffraction grating pattern. In these figures, two chips are affixed to each sample base. Two chips are mounted so that the diffraction grating patterns of the chips are disposed perpendicular to one another in the case where, for example, the calibration of the scan direction of an electron beam is carried out in two directions. While the present invention can be applied to cases where a single chip is affixed to the sample base in the same manner, detailed description of such cases are omitted herein.

The perpendicular relationship between the diffraction grating patterns in the two chips is ensured in the following manner. Many chips formed on a wafer (all of the patterns are disposed in parallel) are cut out. Two chips are displaced from one another by 90 degrees and accurately set against a jig (not shown) for obtaining a straight line, using the cut surfaces as references, such that the diffraction grating pattern of the chips can be displaced perpendicular to one another. In this manner, the perpendicular relationship is obtained in FIGS. 1 to 5.

Figure 1:
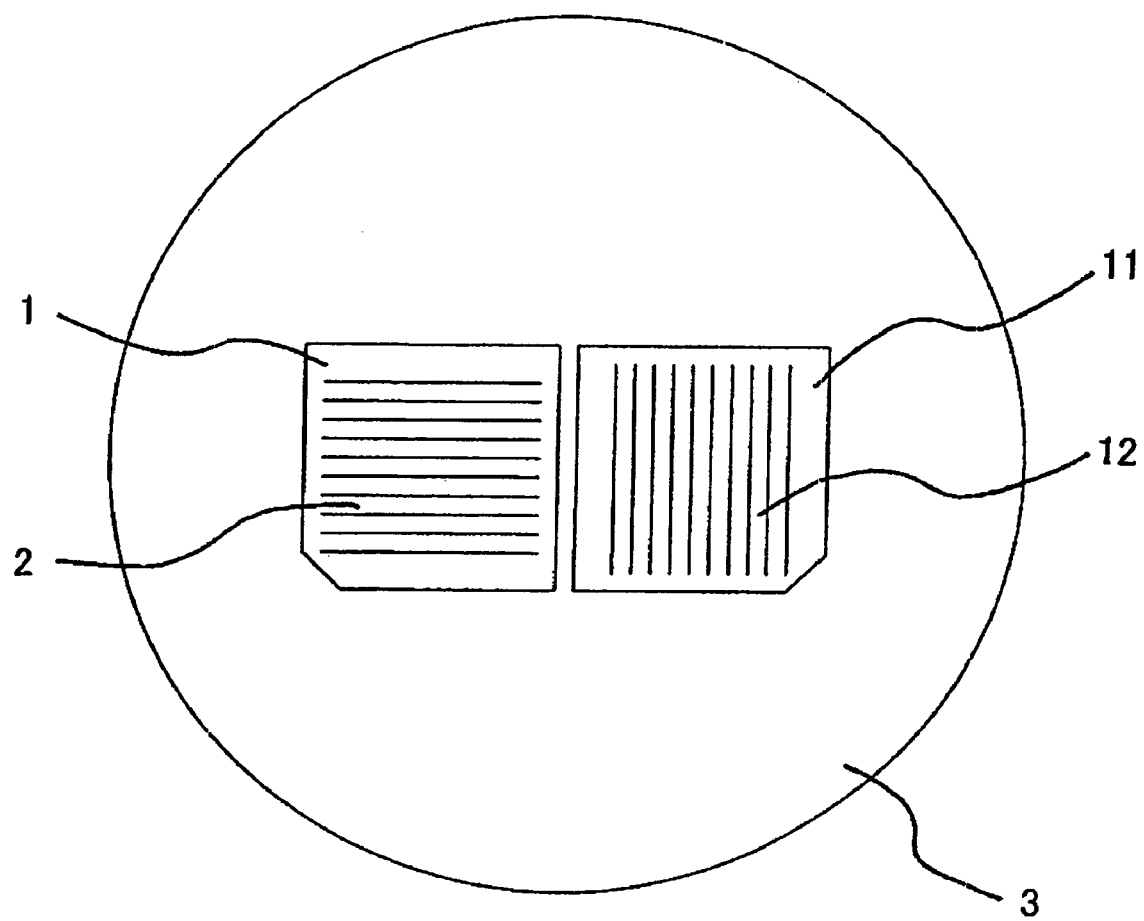
FIG. 1 shows a plane view of a nanoscale standard sample according to a first embodiment of the invention after the affixing of a chip.

FIG. 1 shows an embodiment of a nanoscale two-dimensional standard sample in which square chips each of which has one of its corners cut off are mounted on a sample base. Two chips 1 and 11 having diffraction grating patterns 2 and 12, respectively, are arranged perpendicular to one another and affixed to a sample base 3. Thus, an accurate directional relationship can be maintained between the diffraction grating patterns 2 and 12 and the chips 1 and 11.

Figure 2:
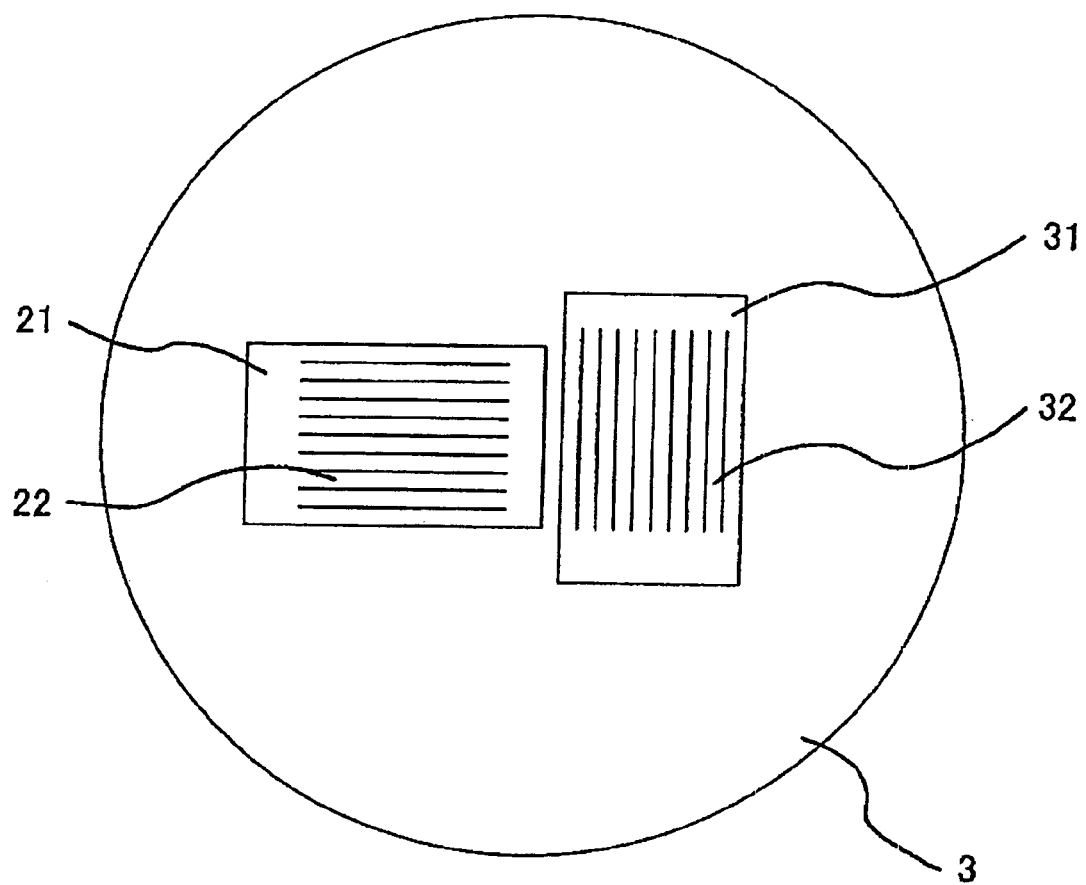
FIG. 2 shows a plane view of a nanoscale standard sample according to a second embodiment of the invention after the affixing of a chip.

FIG. 2 shows another embodiment where the chips are processed and cut in a rectangular shape such that the direction of diffraction grating patterns 21 and 31 is parallel with the longitudinal direction of the chips 22 and 32. The chips 22 and 32 are mounted on the sample base 3 such that they are perpendicular to one another.

Figure 3:
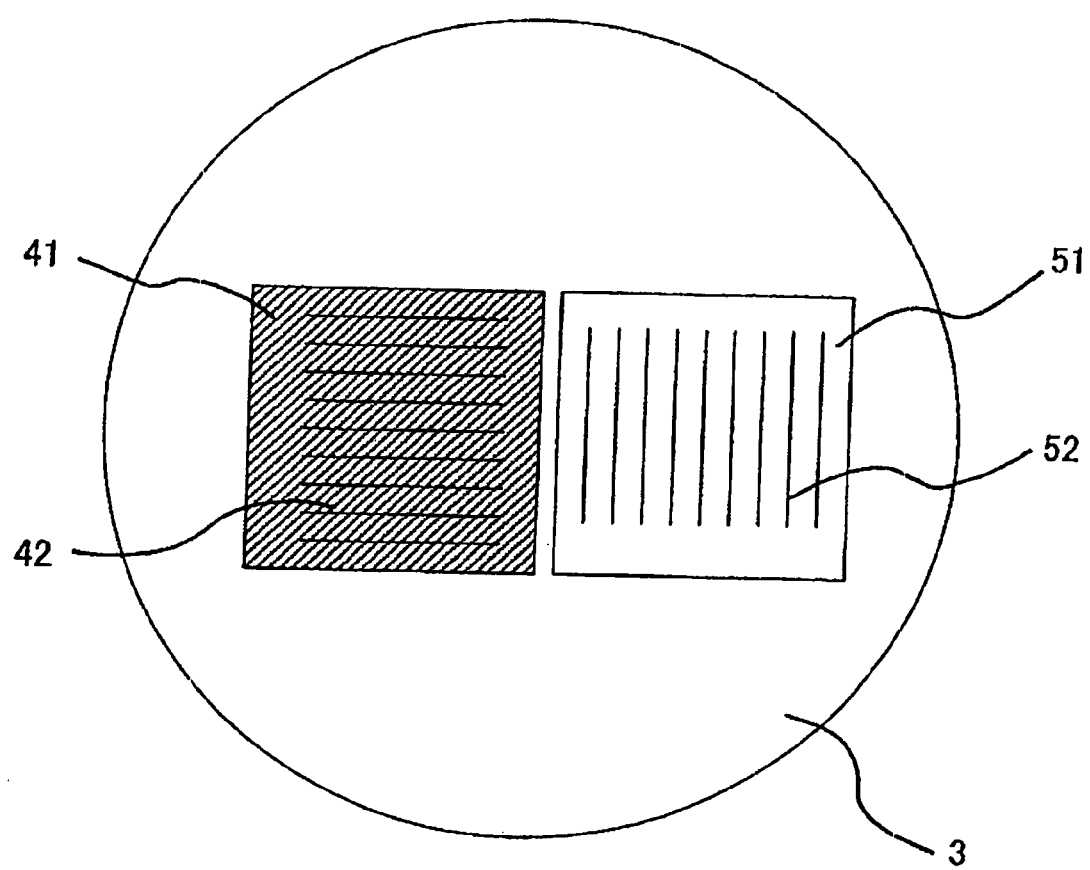
FIG. 3 shows a plane view of a nanoscale standard sample according to a third embodiment of the invention after the affixing of a chip.

FIG. 3 shows another embodiment where two chips 41 and 51 are provided with different colors, or one of the chips 41 and 51 is provided with a color, such that the directions of the diffraction grating patterns 42 and 52 can be recognized. The diagonal lines in the chip 41 indicate that the chip 41 has a different color from that of the chip 51.

Figure 4:
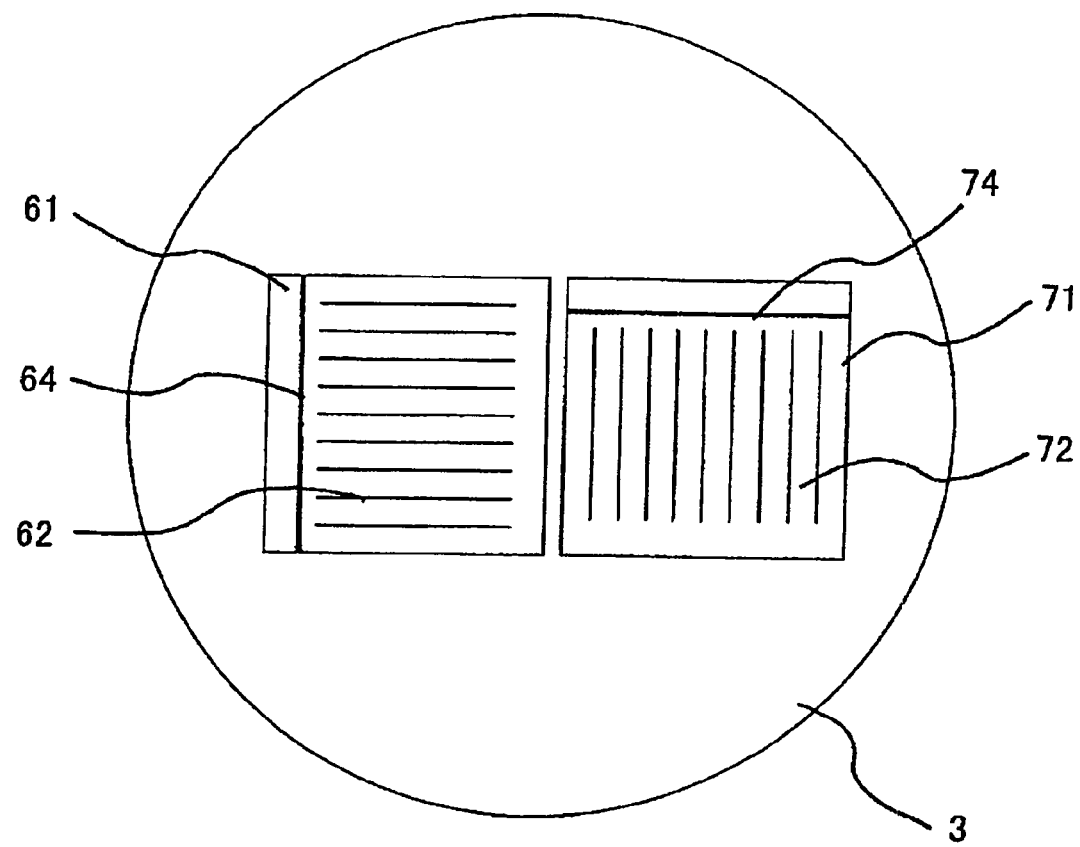
FIG. 4 shows a plane view of a nanoscale standard sample according to a fourth embodiment of the invention after the affixing of a chip.

FIG. 4 shows another embodiment where chips 61 and 71 mounted on the sample base 3 are provided with marking-off lines 64 and 74, respectively, perpendicular to diffraction grating patterns 62 and 72, respectively.

Figure 5:
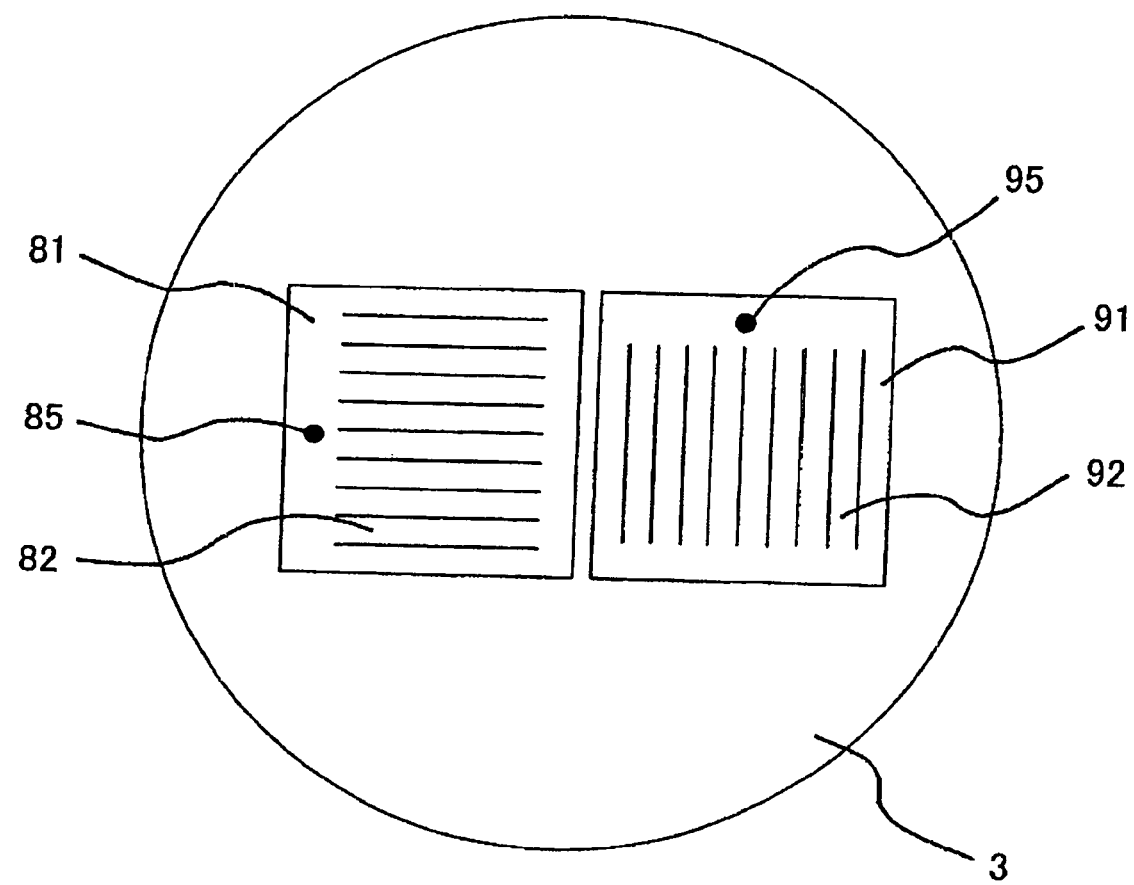
FIG. 5 shows a plane view of a nanoscale standard sample according to a fifth embodiment of the invention after the affixing of a chip.

FIG. 5 shows another embodiment where chips 81 and 91 mounted on the sample base 3 are provided with laser markings 85 and 95, respectively, in parallel with diffraction grating patterns 82 and 92, respectively.

Figure 6:
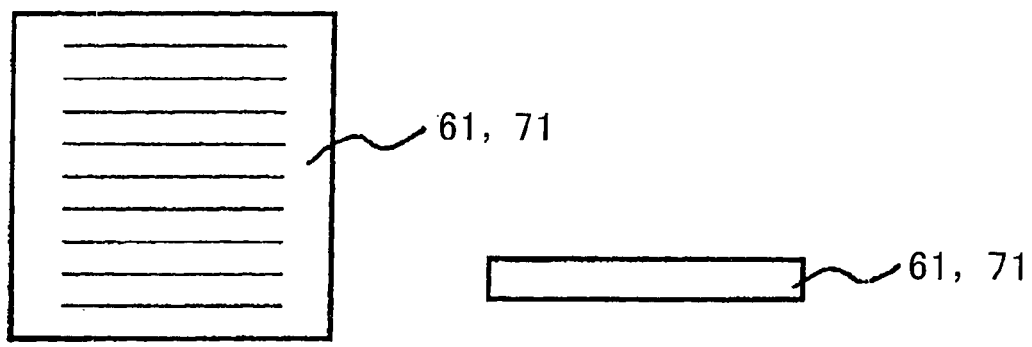
FIG. 6 shows a flowchart illustrating the prevention of foreign matter during the process of providing a chip with a marker.
Figure 6:
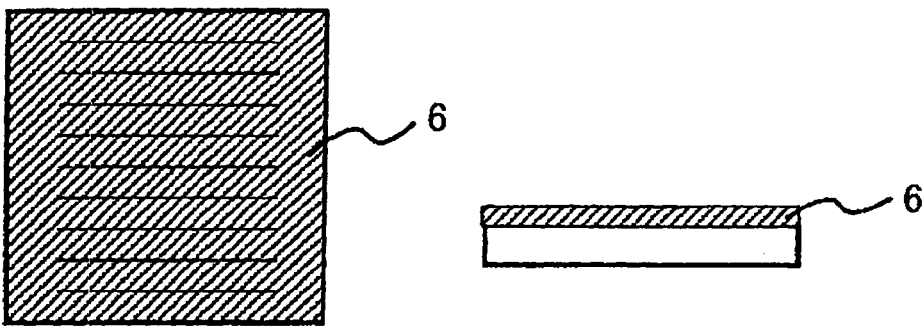
Figure 6:
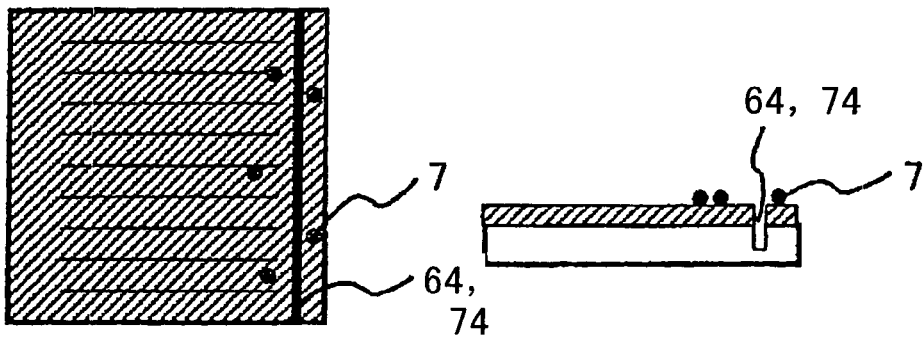
Figure 6:
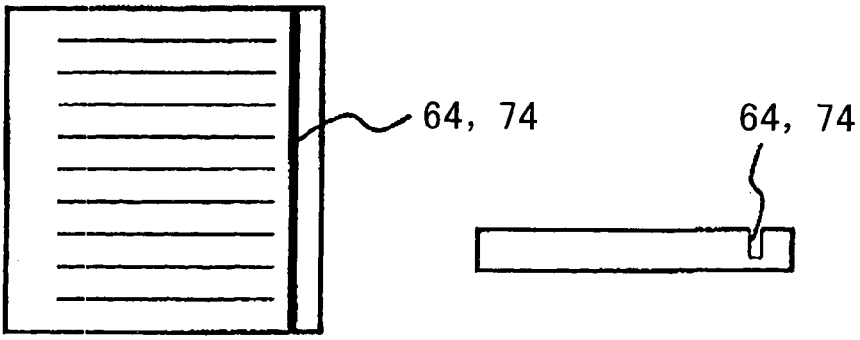

The marking-off lines 64 and 74 are preferably provided by a method such that foreign matter 7 such as chip fragments that could be produced during dicing can be prevented from attaching to the diffraction grating patterns. FIG. 6 shows a method for preventing the attachment of foreign matter 7 to the chips 61 and 71 shown in FIG. 4 when providing the chips with marking-off lines 64 and 74. In this method, the surface of the chips is coated with a protection film 6 before dicing. After the marking-off lines 64 and 74 are provided, the protection film 6 is removed.

Figure 7:
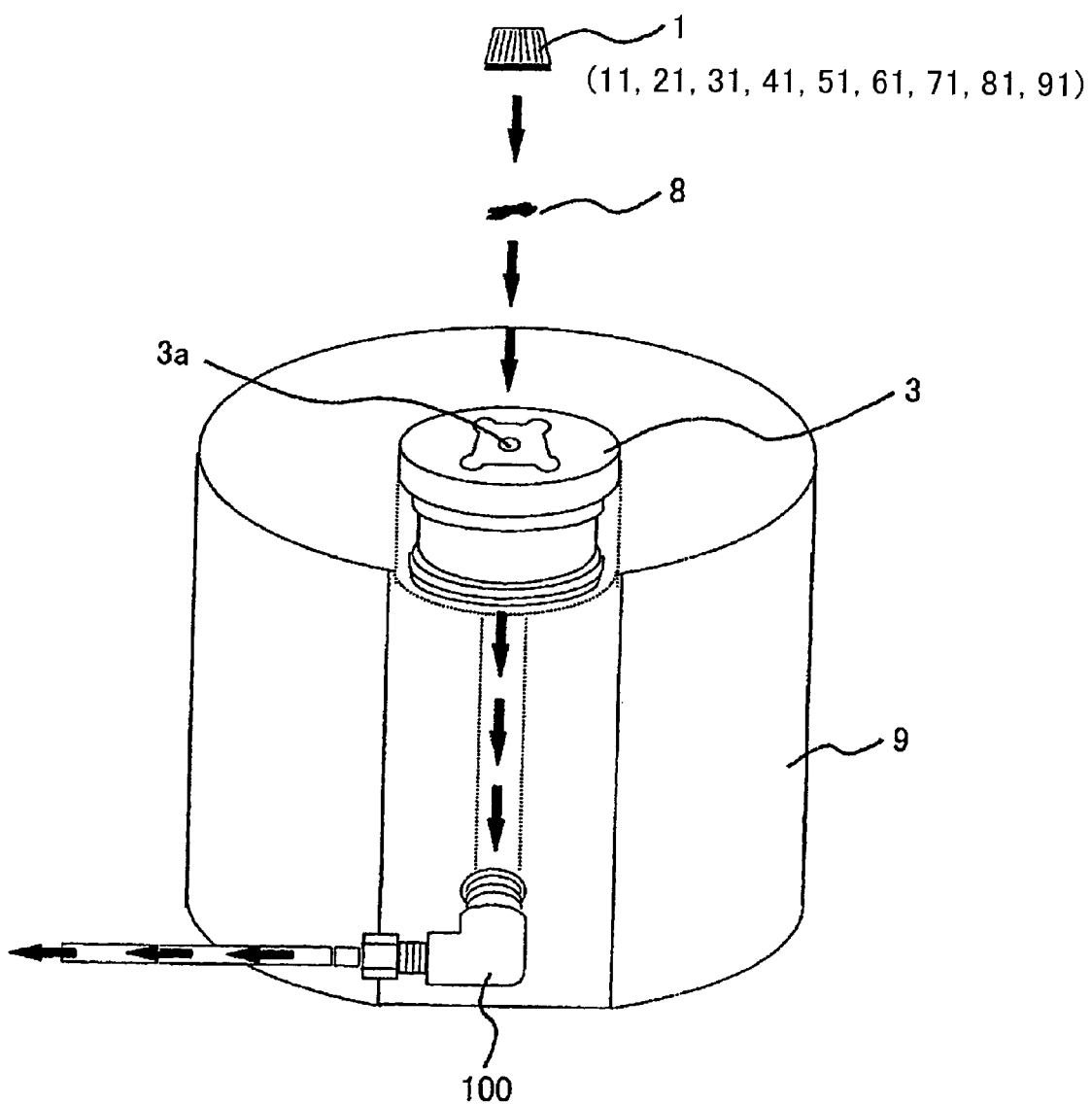
FIG. 7 shows a perspective view for the explanation of a method of affixing a chip using vacuum adsorption for the protection of the nanoscale pattern surface of the chip.
Figure 8:
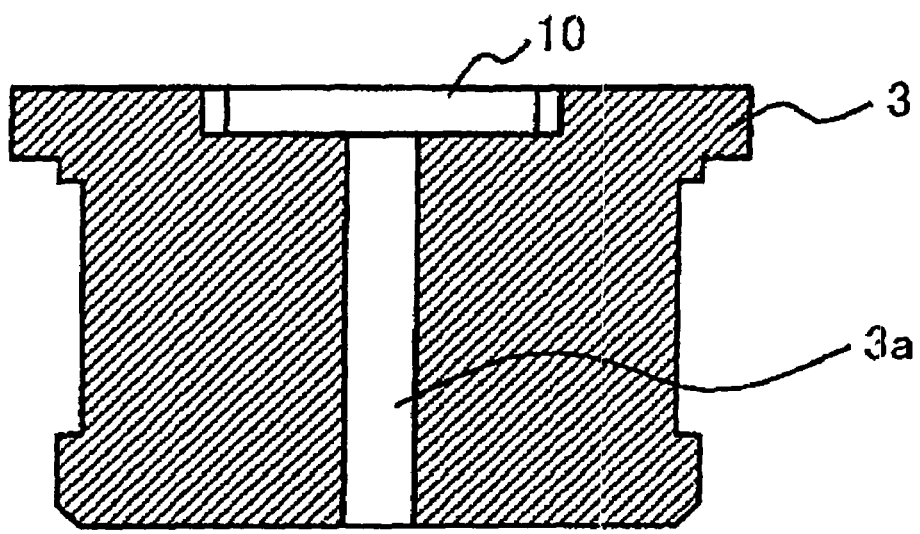
FIG. 8 shows a cross-section of a sample base for a nanoscale standard sample that is used by the chip affixing method using vacuum adsorption.
Figure 8:
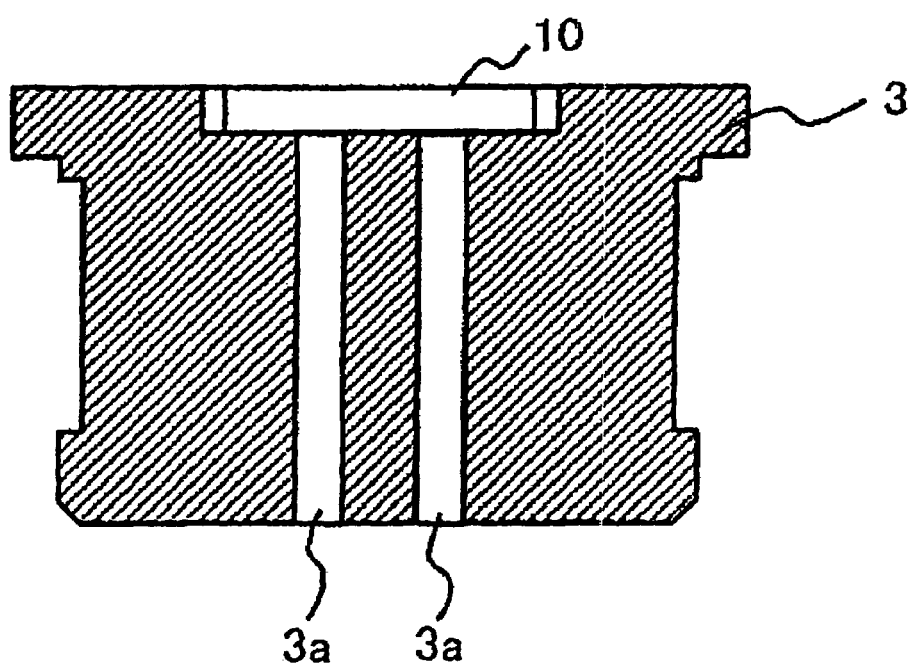

It is also important not to scratch the chip surface when affixing the chips FIG. 7 shows a method of affixing the chip 1 to the sample base 3 with glue 8, using a vacuum adsorption affixing jig 9 in combination with a vacuum adsorption apparatus 100. By thus using the vacuum adsorbing method, the chip 1 can be fixed to the sample base 3 without making contact with the chip 1. FIG. 8 shows an example of the sample base 3 in which one or more through-holes 3a is formed. By using the sample base 3, the through-hole 3a is formed in the portion 10 of the sample base 3 where the chip 1 is affixed, namely a back surface of the pattern of the chip 1 having a diffraction grating pattern. After setting the sample base 3 for the nanoscale standard sample, the glue 8 is applied to the spot facing provided as the chip-affixed portion 10. The glue 8 is applied in such a manner that the opening of the through-hole 3a for vacuum adsorption in the sample-chip affixing portion 10 is not blocked. After confirming the direction of the diffraction grating pattern on the chip 1, the chip 1 is placed on the affixing portion and vacuumed from below the sample base 3 using the jig 9. Thus, the chip 1 is vacuumed from below so that the chip 1 can be fixed to the sample base 3 without making contact with the chip surface.

Thus, in accordance with the above-described embodiment of the invention, the direction of the diffraction grating pattern can be visually determined from the chip affixed to the nanoscale standard sample. As a result, the diffraction grating pattern can be easily directed in a desired direction during manufacture, and also operation errors such as one in which the pattern direction is mistaken can be prevented. The invention also makes it possible to affix the chip without causing scratches on the chip surface.

Thus, in accordance with the invention, a nanoscale standard sample can be affixed to the sample base without making errors in the pattern direction of the sample and in the direction in which the chip is affixed.

What is claimed is:

1. A nanoscale standard sample comprising a sample base on which a chip having a diffraction grating pattern formed thereon is attached, wherein the chip is provided with an indicator permitting the direction of the diffraction grating pattern to be determined from the external appearance of the indicator.

2. The nanoscale standard sample according to claim 1, wherein the indicator is provided on an upper surface of the chip.

3. The nanoscale standard sample according to claim 1, wherein the chip has one of its corners cut off.

4. The nanoscale standard sample according to claim 1, wherein the chip is rectangular in shape.

5. A nanoscale standard sample comprising a sample base on which chips each having a diffraction grating pattern formed thereon are attached, wherein each chip is provided with an indicator permitting the direction of the diffraction grating pattern to be determined from the external appearance of the indicator, the chips being attached on the sample base such that their diffraction grating patterns are perpendicular to each other.

6. The nanoscale standard sample according to claim 5, wherein the chips are provided with different colors indicating the difference in pattern direction.

7. A method of manufacturing a nanoscale standard sample comprising the steps of forming an indicator on a portion of a chip having a diffraction grating pattern formed thereon, by a mechanical, chemical or electromagnetic-wave processing, the indicator permitting the visual determination of the direction of the diffraction grating pattern, and attaching the chip on a sample base.

8. The method of manufacturing a nanoscale standard sample according to claim 7, wherein the mechanical processing is dicing, the chemical processing is chemical etching, and the electromagnetic-wave processing is laser marking, and wherein the indicator is a marking-off line, an etching mark, or laser marking.

9. The method of manufacturing a nanoscale standard sample according to claim 8, wherein the chip surface is coated with a protection film when providing the marking-off line or a mark by dicing or laser marking.

10. The method of manufacturing a nanoscale standard sample according to claim 8, wherein the chip having the diffraction grating pattern is affixed to the sample base by a vacuum adsorbing method prior to processing.

11. The method of manufacturing a nanoscale standard sample according to claim 7, wherein the chip is fixedly attached to the sample base by vacuum adsorption via a through-hole provided in the sample base.

* * * * *